US009633663B2

(12) United States Patent
Heuberger et al.

(10) Patent No.: US 9,633,663 B2
(45) Date of Patent: Apr. 25, 2017

(54) APPARATUS, METHOD AND COMPUTER PROGRAM FOR AVOIDING CLIPPING ARTEFACTS

(71) Applicant: FRAUNHOFER-GESELLSCHAFT ZUR FOERDERUNG DER ANGEWANDTEN FORSCHUNG E.V., Munich (DE)

(72) Inventors: Albert Heuberger, Erlangen (DE); Bernd Edler, Hannover (DE); Nikolaus Rettelbach, Nuremberg (DE); Stefan Geyersberger, Wuerzburg (DE); Johannes Hilpert, Nuremberg (DE)

(73) Assignee: Fraunhofer-Gesellschaft zur Foederung der angewandten Forschung e.V., Munich (DE)

( * ) Notice: Subject to any disclaimer, the term of this patent is extended or adjusted under 35 U.S.C. 154(b) by 235 days.

(21) Appl. No.: 14/304,682

(22) Filed: Jun. 13, 2014

(65) Prior Publication Data

US 2014/0297293 A1 Oct. 2, 2014

Related U.S. Application Data

(63) Continuation of application No. PCT/EP2012/075591, filed on Dec. 14, 2012.

(Continued)

(51) Int. Cl.

*G10L 21/00* (2013.01)
*G10L 19/008* (2013.01)

(Continued)

(52) U.S. Cl.

CPC .......... *G10L 19/008* (2013.01); *G10L 19/032* (2013.01); *G10L 25/69* (2013.01)

(58) Field of Classification Search

USPC ............... 704/500, 208, 219, 258, 233, 201; 381/104, 102, 94.3, 320; 700/94;

(Continued)

(56) References Cited

U.S. PATENT DOCUMENTS

| | | | | |
|---|---|---|---|---|
| 5,765,127 A * | 6/1998 | Nishiguchi | ......... G10L 19/0212 | 704/208 |
| 6,987,821 B1 * | 1/2006 | Li | ......... G10L 25/90 | 375/345 |

(Continued)

FOREIGN PATENT DOCUMENTS

| | | |
|---|---|---|
| CN | 101076008 A | 11/2007 |
| CN | 101605111 A | 12/2009 |

(Continued)

OTHER PUBLICATIONS

"Encoder clippiing prevention . . . , Annoying clipping due to quantisation . . . ", Retrieved on Nov. 14, 2013 from url:http://www.hydrogenaudio.org/forums/index.php?showtopic=53537, Apr. 10, 2007, 9 pages.

*Primary Examiner* — Paras D Shah
*Assistant Examiner* — Neeraj Sharma
(74) *Attorney, Agent, or Firm* — Michael A. Glenn; Perkins Coie LLP

(57) ABSTRACT

An audio encoding apparatus includes an encoder for encoding a time segment of an input audio signal to be encoded to obtain a corresponding encoded signal segment. The audio encoding apparatus further includes a decoder for decoding the encoded signal segment to obtain a re-decoded signal segment. A clipping detector is provided for analyzing the re-decoded signal segment with respect to at least one of an actual signal clipping or an perceptible signal clipping and for generating a corresponding clipping alert. The encoder is further configured to again encode the time segment of the (Continued)

audio signal with at least one modified encoding parameter resulting in a reduced clipping probability in response to the clipping alert.

28 Claims, 4 Drawing Sheets

Related U.S. Application Data

(60) Provisional application No. 61/576,099, filed on Dec. 15, 2011.

(51) Int. Cl.

| | |
|---|---|
| ***G10L 25/69*** | (2013.01) |
| ***G10L 19/032*** | (2013.01) |
| *G10L 15/00* | (2013.01) |
| *G10L 13/00* | (2006.01) |
| *H03G 3/00* | (2006.01) |
| *H04L 27/08* | (2006.01) |
| *H04B 15/00* | (2006.01) |
| *G06F 11/00* | (2006.01) |
| *H04R 25/00* | (2006.01) |
| *G06F 17/00* | (2006.01) |
| *H03G 9/00* | (2006.01) |

(58) Field of Classification Search
USPC .................. 714/746, 701; 702/189; 375/345
See application file for complete search history.

(56) References Cited

U.S. PATENT DOCUMENTS

| | | | | |
|---|---|---|---|---|
| 8,200,351 | B2 * | 6/2012 | Kurniawati | G10L 19/008 381/104 |
| 9,219,973 | B2 * | 12/2015 | Muesch | G10L 21/0208 |
| 2003/0163305 | A1 * | 8/2003 | Cheng | G10L 19/018 704/219 |
| 2006/0122814 | A1 * | 6/2006 | Beens | G06F 15/7864 702/189 |
| 2007/0239295 | A1 | 10/2007 | Thompson et al. | |
| 2009/0210235 | A1 | 8/2009 | Shirakawa et al. | |
| 2009/0254783 | A1 * | 10/2009 | Hirschfeld | G10L 19/0017 714/701 |
| 2010/0174960 | A1 | 7/2010 | Suzuki et al. | |
| 2010/0266142 | A1 | 10/2010 | Huijnen et al. | |
| 2011/0004469 | A1 * | 1/2011 | Sato | G10L 19/07 704/219 |
| 2011/0173004 | A1 * | 7/2011 | Bessette | G10L 19/005 704/500 |
| 2011/0208528 | A1 * | 8/2011 | Schildbach | G10L 19/173 704/500 |

FOREIGN PATENT DOCUMENTS

| | | | |
|---|---|---|---|
| CN | 101897118 | A | 11/2010 |
| EP | 2093758 | | 8/2009 |
| EP | 2161720 | | 3/2010 |
| KR | 1020100009642 | A | 1/2010 |
| RU | 2220511 | C2 | 12/2003 |
| WO | 2007098258 | A1 | 8/2007 |

* cited by examiner

APPARATUS, METHOD AND COMPUTER PROGRAM FOR AVOIDING CLIPPING ARTEFACTS

CROSS-REFERENCE TO RELATED APPLICATIONS

This application is a continuation of copending International Application No. PCT/EP2012/075591, filed Dec. 14, 2012, which is incorporated herein by reference in its entirety, and additionally claims priority from U.S. Application No. 61/576,099, filed Dec. 15, 2011, which are all incorporated herein by reference in their entirety.

BACKGROUND OF THE INVENTION

In current audio content production and delivery chains the digitally available master content (PCM stream) is encoded e.g. by a professional AAC encoder at the content creation site. The resulting AAC bitstream is then made available for purchase e.g. through the Apple iTunes Music store. It appeared in rare cases that some decoded PCM samples are "clipping" which means that two or more consecutive samples reached the maximum level that can be represented by the underlying bit resolution (e.g. 16 bit) of a uniformly quantized fixed point representation (PCM) for the output wave form. This may lead to audible artifacts (clicks or short distortion). Since this happens at the decoder side, there is no way of resolving the problem after the content has been delivered. The only way to handle this problem at the decoder side would be to create a "plug-in" for decoders providing anti-clipping functionality. Technically this would mean a modification of the energy distribution in the subbands (however only on a forward mode, i.e. there would be no iteration loop which takes into account the psychoacoustic model . . . ). Assuming an audio signal at the encoder's input that is below the threshold of clipping, the reasons for clipping in a modern perceptual audio encoder are manifold. First of all, the audio encoder applies quantization to the transmitted signal which is available in a frequency decomposition of the input wave form in order to reduce the transmission data rate. Quantization errors in the frequency domain result in small deviations of the signal's amplitude and phase with respect to the original waveform. If amplitude or phase errors add up constructively, the resulting amplitude in the time domain may temporarily be higher than the original waveform. Secondly parametric coding methods (e.g. Spectral Band Replication, SBR) parameterize the signal power in a rather coarse manner. Phase information is omitted. Consequently the signal at the receiver side is only regenerated with correct power but without waveform preservation. Signals with an amplitude close to full scale are prone to clipping.

Since in the compressed bitstream representation the dynamic range of the frequency decomposition is much larger than a typical 16-bit PCM range, the bitstream can carry higher signal levels. Consequently the actual clipping appears only, when the decoders output signal is converted (and limited) to a fixed point PCM representation.

It would be desirable to prevent the occurrence of clipping at the decoder by providing an encoded signal to the decoder that does not exhibit clipping so that there is no need for implementing a clipping prevention at the decoder. In other words, it would be desirable if the decoder can perform standard decoding without having to process the signal with respect to clipping prevention. In particular, a lot of decoders are already deployed nowadays and these decoders would have to be upgraded in order to benefit from a decoder-side clipping prevention. Furthermore, once clipping has occurred (i.e., the audio signal to be encoded has been encoded in a manner that is prone to the occurrence of clipping), some information may be irrecoverably lost so that even a clipping prevention-enabled encoder may have to resort to extrapolating or interpolating the clipped signal portion on the basis of preceding and/or subsequent signal portions.

SUMMARY

According to an embodiment, an audio encoding apparatus may have: an encoder for encoding a time segment of an input audio signal to be encoded to obtain a corresponding encoded signal segment; a decoder for decoding the encoded signal segment to obtain a re-decoded signal segment; and a clipping detector for analyzing the re-decoded signal segment with respect to at least one of an actual signal clipping or an perceptible signal clipping and for generating a corresponding clipping alert; wherein the encoder is further configured to again encode the time segment of the audio signal with at least one modified encoding parameter resulting in a reduced clipping probability in response to the clipping alert, the at least one modified encoding parameter causing the encoder to modify a rounding procedure in a quantizer by selecting a smaller quantization threshold for a frequency coefficient.

According to another embodiment, a method for audio encoding may have the steps of: encoding a time segment of an input audio signal to be encoded to obtain a corresponding encoded signal segment; decoding the encoded signal segment to obtain a re-decoded signal segment; analyzing the re-decoded signal segment with respect to at least one of an actual or an perceptual signal clipping; generating a corresponding clipping alert; and in dependence of the clipping alert repeating the encoding of the time segment with at least one modified encoding parameter resulting a reduced clipping probability, the at least one modified encoding parameter causing a modification of a rounding procedure by selecting a smaller quantization threshold for a frequency coefficient.

Another embodiment may have a computer program for implementing the inventive method when being executed on a computer or a signal processor.

According to an embodiment, an audio encoding apparatus is provided. The audio encoding apparatus comprises an encoder, a decoder, and a clipping detector. The encoder is adapted to encode a time segment of an input audio signal to be encoded to obtain a corresponding encoded signal segment. The decoder is adapted to decode the encoded signal segment to obtain a re-decoded signal segment. The clipping detector is adapted to analyze the re-decoded signal segment with respect to at least one of an actual signal clipping or an perceptible signal clipping. The clipping detector is also adapted to generate a corresponding clipping alert. The encoder is further configured to again encode the time segment of the audio signal with at least one modified encoding parameter resulting in a reduced clipping probability in response to the clipping alert.

In a further embodiment, a method for audio encoding is provided. The method comprises encoding a time segment of an input audio signal to be encoded to obtain a corresponding encoded signal segment. The method further comprises decoding the encoded signal segment to obtain a re-decoded signal segment. The re-decoded signal segment is analyzed with respect to at least one of an actual or an perceptual signal clipping. In case an actual or an perceptual signal clipping is detected within the analyzed re-decoded signal segment, a corresponding clipping alert is generated. In dependence of the clipping alert the encoding of the time segment is repeated with at least one modified encoding parameter resulting a reduced clipping probability.

A further embodiment provides a computer program for implementing the above method when executed on a computer or a signal processor.

Embodiments of the present invention are based on the insight that every encoded time segment can be verified with respect to potential clipping issues almost immediately by decoding the time segment again. Decoding is substantially less computationally elaborate than encoding. Therefore, the processing overhead caused by the additional decoding is typically acceptable. The delay introduced by the additional decoding is typically also acceptable, for example for streaming media applications (e.g., internet radio): As long as a repeated encoding of the time segment is not necessitated, that is, as long as no potential clipping is detected in the re-decoded time segment of the input audio signal, the delay is approximately one time segment, or slightly more than one time segment. In case the time segment has to be encoded again because a potential clipping problem has been identified in a time segment, the delay increases. Nevertheless, the typical maximal delay that should be expected and taken into account is typically still relatively short.

BRIEF DESCRIPTION OF THE DRAWINGS

Embodiments of the present invention will be detailed subsequently referring to the appended drawings, in which.

DETAILED DESCRIPTION OF THE INVENTION

As explained above, the reasons for clipping in a modern perceptual audio encoder are manifold. Even when we assume an audio signal at the encoder's input that is below the threshold of clipping, a decoded signal may nevertheless exhibit clipping behavior. In order to reduce the transmission data rate, the audio encoder may applies quantization to the transmitted signal which is available in a frequency decomposition of the input wave form. Quantization errors in the frequency domain result in small deviations of the decoded signal's amplitude and phase with respect to the original waveform. Another possible source for differences between the original signal and the decoded signal may be parametric coding methods (e.g. Spectral Band Replication, SBR) parameterize the signal power in a rather coarse manner. Consequently the decoded signal at the receiver side is only regenerated with correct power but without waveform preservation. Signals with an amplitude close to full scale are prone to clipping.

The new solution to the problem is to combine both encoder and decoder to a "codec" system that automatically adjusts the encoding process on a per segment/frame basis in a way that the above described "clipping" is eliminated. This new system consists of an encoder that encodes the bitstream and before this bitstream is output, a decoder constantly decodes this bitstream in parallel to monitor if any "clipping" occurs. If such clipping occurs, the decoder will trigger the encoder to perform a re-encode of that segment/frame (or several consecutive frames) with different parameters so that no clipping occurs any more.

Figure 1:
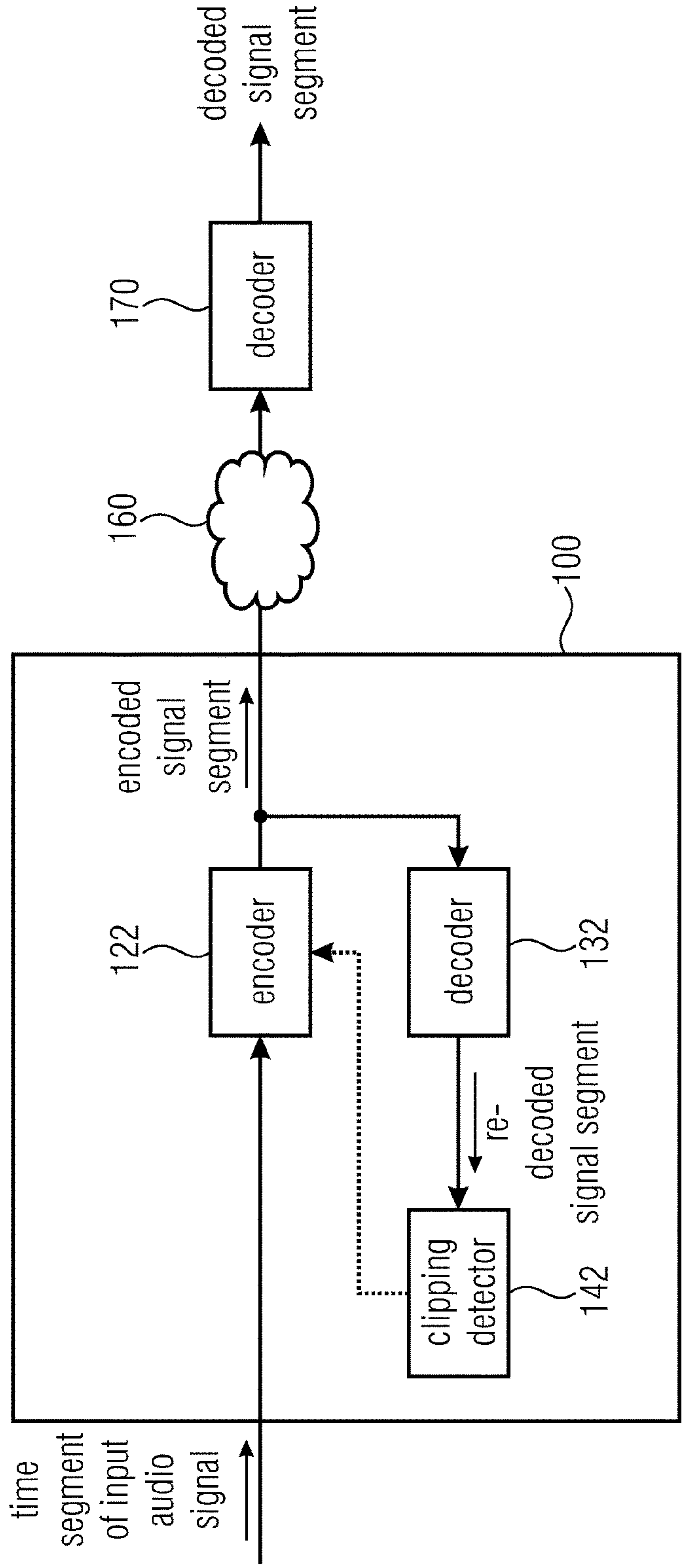
FIG. 1 shows a schematic block diagram of an audio encoding apparatus according to at least some embodiments of the present invention.

FIG. 1 shows a schematic block diagram of an audio encoding apparatus 100 according to embodiments. FIG. 1 also schematically illustrates a network 160 and a decoder 170 at a receiving end. The audio encoding apparatus 100 is configured to receive an original audio signal, in particular a time segment of an input audio signal. The original audio signal may be provided, for example, in a pulse code modulation (PCM) format, but other representations of the original audio signal are also possible. The audio encoding apparatus 100 comprises a encoder 122 for encoding the time segment and for producing a corresponding encoded signal segment. The encoding of the time segment performed by the encoded 122 may be based on an audio encoding algorithm, typically with the purpose of reducing the amount of data necessitated for storing or transmitting the audio signal. The time segment may correspond to a frame of the original audio signal, to a "window" of the original audio signal, to a block of the original audio signal, or to another temporal section of the original audio signal. Two or more segments may overlap each other.

The encoded signal segment is normally sent via the network 160 to the decoder 170 at the receiving end. The decoder 170 is configured to decode the received encoded signal segment and to provide a corresponding decoded signal segment which may then be passed on to further processing, such as digital-to-audio conversion, amplification, and to an output device (loudspeaker, headphones, etc).

The output of the encoder 122 is also connected to an input of the decoder 132, in addition to a network interface for connecting the audio encoding apparatus 100 with the network 160. The decoder 132 is configured to de-code the encoded signal segment and to generate a corresponding re-decoded signal segment. Ideally, the re-decoded signal segment should be identical to the time segment of the original signal. However, as the encoder 122 may be configured to significantly reduce the amount of data, and also for other reasons, the re-decoded signal segment may differ from the time segment of the input audio signal. In most cases, these differences are hardly noticeable, but in some cases the differences may result in audible disturbances within the re-decoded signal segment, in particular when the audio signal represented by the re-decoded signal segment exhibits a clipping behavior.

The clipping detector 142 is connected to an output of the decoder 132. In case the clipping detector 132 finds that the re-decoded audio signal contains one or more samples that can be interpreted as clipping, it issues a clipping alert via the connection drawn as dotted line to the encoder 122 which causes the encoder 122 to encode the time segment of the original audio signal again, but this time with at least one modified encoding parameter, such as a reduced overall gain or a modified frequency weighting in which at least one frequency area or band is attenuated compared to the previously used frequency weighting. The encoder 122 outputs a second encoded signal segment that supersedes the previous encoded signal segment. The transmission of the previous encoded signal segment via the network 160 may be delayed until the clipping detector 142 has analyzed the corresponding re-decoded signal segment and has found no potential clipping. In this manner, only encoded signal segments are sent to the receiving end that have been verified with respect to the occurrence of potential clipping.

Optionally, the decoder 132 or the clipping detector 142 will assess the audibility of such clipping. In case the effect of clipping is below a certain threshold of audibility, the decoder will proceed without modification. The following methods to change parameters are feasible:

Simple method: slightly reduce the gain of that segment/frame (or several consecutive frames) at the encoder input stage by a constant frequency independent factor that avoids clipping at the decoders output. The gain can be adapted in every frame according to the signal properties. If necessitated, one or more iterations may be performed with decreasing gains, as it may not be deterministic that a reduction of the level at the encoder input leads to a reduction of the level at the decoder output: As the case may be, the encoder might select different quantization steps that may have an unfavorable effect with respect to clipping.

Advanced method #1: perform a re-quantization at the frequency domain in those frequency areas that contribute the most energy to the overall signal or in the frequencies that are perceptual least relevant. If the clipping is caused by quantization errors, two methods are appropriate:

a) modify the rounding procedure in the quantizer to select the smaller quantization threshold for the frequency coefficient carrying the highest power contribution in the frequency band that is supposed to contribute most to the clipping problem b) increase quantization precision in a certain frequency band to reduce the amount of quantization error c) Repeat steps a) and b) until clipping free behavior is determined in the encoder Advanced method #2 (this method is similar to a crest factor reduction in OFDM (orthogonal frequency division multiplexing) based systems:

a) introduce small (inaudible) changes in amplitude and phase of all subbands/or a subset thereof to reduce the peak amplitude b) assess the audibility of the introduced modification c) check reduction of peak amplitude in the time domain d) repeat steps a) to c) until peak amplitude of the time signal is below the necessitated threshold According to an aspect of the proposed audio encoding apparatus, an "automatic" solution is provided to the problem where no human interaction is necessitated any more to prevent the above-described error from happening. Instead of decreasing overall loudness of the complete signal, loudness is reduced only for short segments of the signal, limiting the change in overall loudness of the complete signal.

Figure 2:
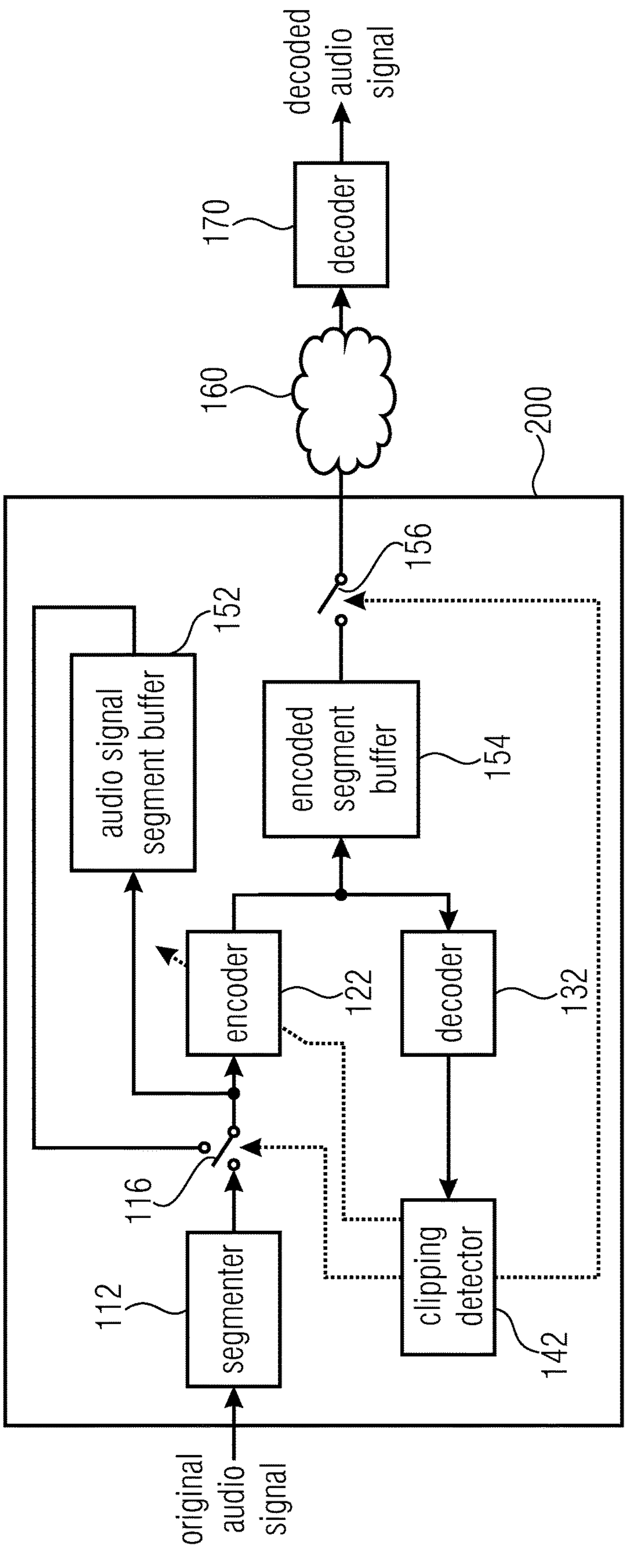
FIG. 2 shows a schematic block diagram of an audio encoding apparatus according to further embodiments of the present invention.

FIG. 2 shows a schematic block diagram of an audio encoding apparatus 200 according to further possible embodiments. The audio encoding apparatus 200 is similar to the audio encoding apparatus 100 schematically illustrated in FIG. 1. In addition to the components illustrated in FIG. 1, the audio encoding apparatus 200 in FIG. 2 comprises a segmenter 112, an audio signal segment buffer 152, and an encoded segment buffer 154. The segmenter 142 is configured for dividing the incoming original audio signal in time segments. The individual time segments are provided to the encoder 122 and also to the audio signal segment buffer 152 which is configured to temporarily store the time segment(s) that is/are currently processed by the encoder 122. Interconnected between an output of the segmenter 142 and the inputs of the encoder 122 and of the audio signal buffer 152 is a selector 116 configured to select either a time segment provided by the segmenter 142 or a stored, previous time segment provided by the audio signal segment buffer to the input of the encoder 122. The selector 116 is controlled by a control signal issued by the clipping detector 142 so that in case the re-decoded signal segment exhibits potential clipping behavior, the selector 116 selects the output of the audio signal segment buffer 142 in order for the previous time segment to be encoded again using at least one modified encoding parameter.

The output of the encoder 122 is connected to the input of the decoder 132 (as is the case for the audio encoding apparatus 100 schematically shown in FIG. 1) and also to an input of the encoded segment buffer 154. The encoded segment buffer 154 is configured for temporarily storing the encoded signal segment pending its decoding performed by the decoder 132 and the clipping analysis performed by the clipping detector 142. The audio encoding apparatus 200 further comprises a switch 156 or release element connected to an output of the encoded segment buffer 154 and the network interface of the audio encoding apparatus 200. The switch 156 is controlled by a further control signal issued by the clipping detector 142. The further control signal may be identical to the control signal for controlling the selector 116, or the further control signal may be derived from said control signal, or the control signal may be derived from the further control signal.

In other words, the audio encoding apparatus 200 in FIG. 2 may comprise a segmenter 112 for dividing the input audio signal to obtain at least the time segment. The audio encoding apparatus may further comprise an audio signal segment buffer 152 for buffering the time segment of the input audio signal as a buffered segment while the time segment is encoded by the encoder and the corresponding encoded signal segment is re-decoded by the decoder. The clipping alert may conditionally cause the buffered segment of the input audio signal to be fed to the encoder again in order to be encoded with the at least one modified encoding parameter. The audio encoding apparatus may further comprise an input selector for the encoder that is configured to receive a control signal from the clipping detector 142 and to select one of the time segment and the buffered segment in dependence on the control signal. Accordingly, the selector 116 may also be a part of the encoder 122, according to some embodiments. The audio encoding apparatus may further comprise an encoded segment buffer 154 for buffering the encoded signal segment while it is re-decoded by the decoder 132 before it is being output by the audio encoding apparatus so that it can be superseded by a potential subsequent encoded signal segment that has been encoded using the at least one modified encoding parameter.

Figure 3:
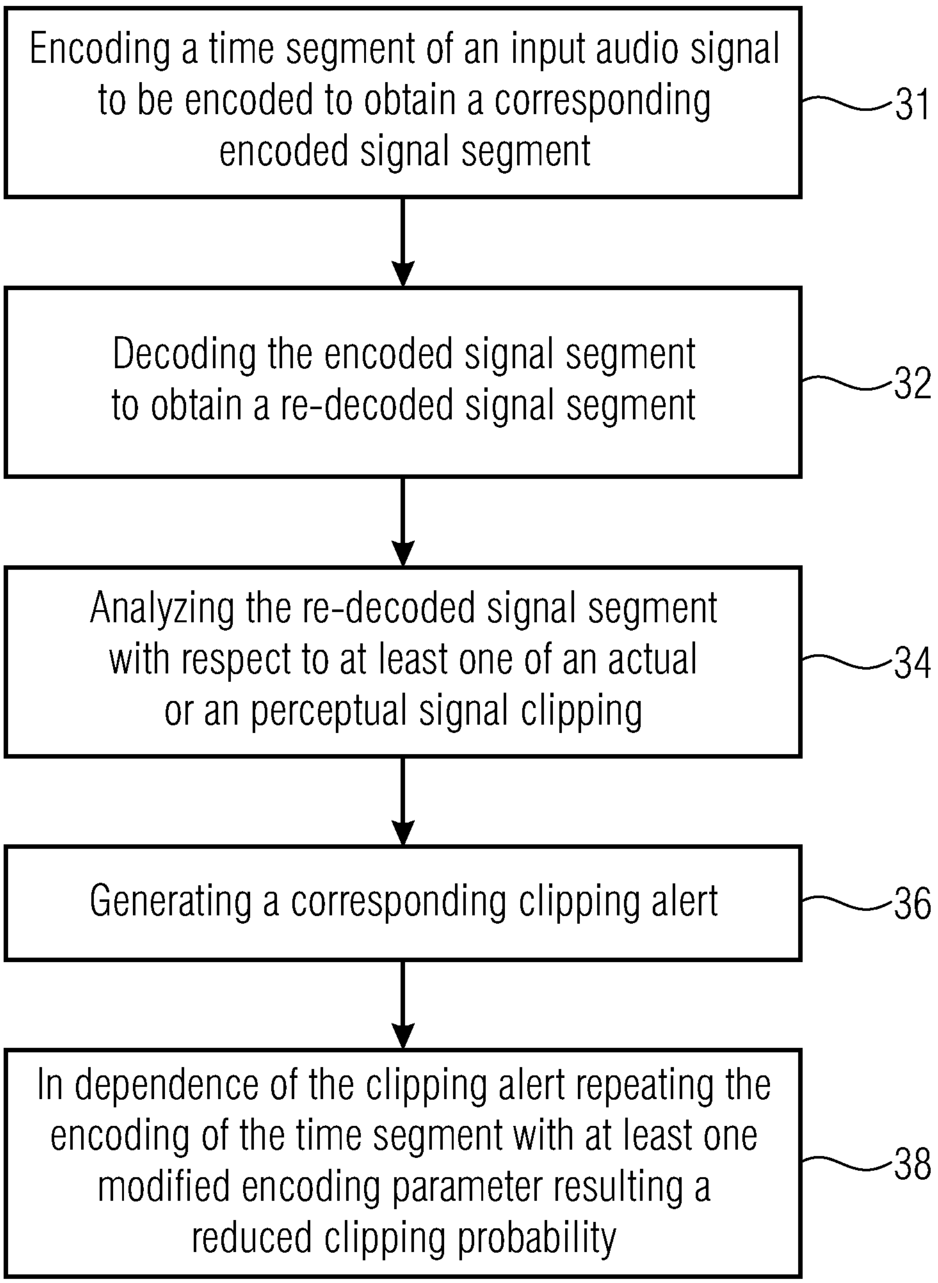
FIG. 3 shows a schematic flow diagram of a method for audio encoding according to at least some embodiments of the present invention.

FIG. 3 shows a schematic flow diagram of a method for audio encoding comprising a step 31 of encoding a time segment of an input audio signal to be encoded. As a result of step 31, a corresponding encoded signal segment is obtained. Still at the transmitting end, the encoded signal segment is decoded again in order to obtain a re-decoded signal segment, at a step 32 of the method. The re-decoded signal segment is analyzed with respect to at least one of an actual or an perceptual signal clipping, as schematically indicated at a step 34. The method also comprises a step 36 during which a corresponding clipping alert is generated in case it has been found during step 34 that the re-decoded signal segment contains one or more potentially clipping audio samples. In dependence of the clipping alert, the encoding of the time segment of the input audio signal is repeated with at least one modified encoding parameter to reduce a clipping probability, at a step 38 of the method.

The method may further comprise dividing the input audio signal to obtain at least the time segment of the input audio signal. The method may further comprise buffering the time segment of the input audio signal as a buffered segment while the time segment is encoded and the corresponding encoded signal segment is re-decoded. The buffered segment may then conditionally encoded with the at least one modified encoding parameter in case the clipping detection has indicated that the probability of clipping is above a certain threshold.

The method may further comprise buffering the encoded signal segment while it is re-decoded and before it is output so that it can be superseded by a potential subsequent encoded signal segment resulting from encoding the time segment again using the at least one modified encoding parameter. The action of repeating the encoding may comprise applying an overall gain to the time segment by the encoder, wherein the overall gain is determined on the basis of the modified encoding parameter.

The action of repeating the encoding may comprise performing a re-quantization in the frequency domain in at least one selected frequency area. The at least one selected frequency area may contribute the most energy in the overall signal or is perceptually least relevant. According to further embodiments of the method for audio encoding, the at least one modified encoding parameter causes a modification of a rounding procedure in a quantizing action of the encoding. The rounding procedure may be modified for a frequency area carrying the highest power contribution.

The rounding procedure may be modified by at least one of selecting a smaller quantization threshold and increasing a quantization precision. The method may further comprise introducing small changes in at least one of amplitude and phase to at least one frequency area to reduce a peak amplitude. Alternatively, or in addition, an audibility of the introduced modification may be assessed. The method may further comprise a peak amplitude determination regarding an output of the decoder for checking a reduction of the peak amplitude in the time domain. The method may further comprise a repetition of the introduction of a small change in at least one of amplitude and phase and the checking of the reduction of the peak amplitude in the time domain until the peak amplitude is below a necessitated threshold.

Figure 4:
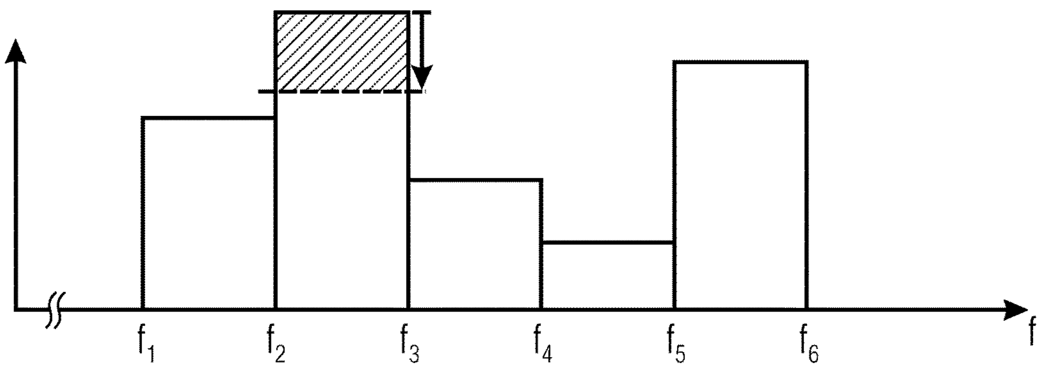
FIG. 4 schematically illustrates a concept of clipping prevention in frequency domain by modifying a frequency area that contributes the most energy to an overall signal output by a decoder.

FIG. 4 schematically illustrates a frequency domain representation of a signal segment and the effect of the at least one modified encoding parameter according to some embodiments. The signal segment is represented in the frequency domain by five frequency bands. Note that this is an illustrative example, only, so that the actual number of frequency band may be different. Furthermore, the individual frequency bands do not have to be equal in bandwidth, but may have increasing bandwidth with increasing frequency, for example. In the example schematically illustrated in FIG. 4, the frequency area or band between frequencies $f_2$ and $f_3$ is the frequency band with the highest amplitude and/or power in the signal segment at hand. We assume that the clipping detector 142 has found that there is a chance of clipping if the encoded signal segment is transmitted as-is to the receiving end and decoded there by means of the decoder 170. Therefore, according to one strategy, the frequency area with the highest signal amplitude/power is reduced by a certain amount, as indicated in FIG. 4 by the hatched area and the downward arrow. Although this modification of the signal segment may slightly change the eventual output audio signal, compared to the original audio signal, it may be less audible (especially without direct comparison to the original audio signal) than a clipping event.

Figure 5:
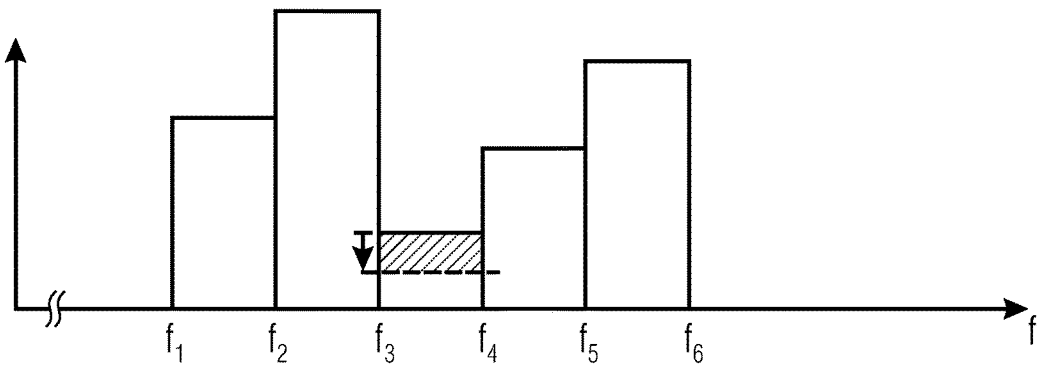
FIG. 5 schematically illustrates a concept of clipping prevention in frequency domain by modifying a frequency area that is perceptually least relevant.

FIG. 5 schematically illustrates a frequency domain representation of a signal segment and the effect of the at least one modified encoding parameter according to some alternative embodiments. In this case, it is not the strongest frequency area that is subjected to the modification prior to the repeated encoding of the audio signal segment, but the frequency area that is perceptually least important, for example according to a psychoacoustic theory or model. In the illustrated case, the frequency area/band between the frequencies $f_3$ and $f_4$ is next to the relatively strong frequency area/band between $f_2$ and $f_3$. Therefore, the frequency area between $f_3$ and $f_4$ is typically considered to be masked by the adjacent two frequency areas which contain significantly higher signal contributions. Nevertheless, the frequency area between $f_3$ and $f_4$ may contribute to the occurrence of a clipping event in the decoded signal segment. By reducing the signal amplitude/power for the masked frequency area between $f_3$ and $f_4$, the clipping probability can be reduced under a desired threshold without the modification being excessively audible or perceptual for a listener.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding unit or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An audio encoding apparatus comprising:

an encoder for encoding a time segment of an input audio signal to be encoded to acquire a corresponding encoded signal segment, the encoder having a quantizer using a quantization threshold as an encoding parameter in the encoding the time segment;

a decoder for decoding the encoded signal segment to acquire a decoded signal segment; and a clipping detector for analyzing the decoded signal segment with respect to at least one of an actual signal clipping or a perceptible signal clipping and for generating a corresponding clipping alert;

wherein the encoder is further configured to again encode the time segment of the input audio signal with at least one modified encoding parameter resulting in a reduced clipping probability in response to the clipping alert, the at least one modified encoding parameter causing the encoder to modify a rounding procedure in the quantizer by selecting a modified quantization threshold for a frequency coefficient, the modified quantization threshold being smaller than the quantization threshold used in the encoding, and wherein at least one of the encoder, the decoder, and the clipping detector comprises a hardware implementation.

2. The audio encoding apparatus according to claim 1, further comprising:

a segmenter for dividing the input audio signal to acquire at least the time segment.

3. The audio encoding apparatus according to claim 1, further comprising:

an audio signal segment buffer for buffering the time segment of the input audio signal as a buffered segment while the time segment is encoded by the encoder and the corresponding encoded signal segment is decoded by the decoder;

wherein the clipping alert conditionally causes the buffered segment of the input audio signal to be fed to the encoder again in order to be encoded with the at least one modified encoding parameter.

4. The audio encoding apparatus according to claim 3, further comprising an input selector for the encoder that is configured to receive a control signal from the clipping detector and to select one of the time segment and the buffered segment in dependence on the control signal.

5. The audio encoding apparatus according to claim 1, further comprising:

an encoded segment buffer for buffering the encoded signal segment while it is decoded by the decoder before it is being output by the audio encoding apparatus so that it can be superseded by a potential subsequent encoded signal segment that has been encoded using the at least one modified encoding parameter.

6. The audio encoding apparatus according to claim 1, wherein the at least one modified encoding parameter comprises an overall gain that is applied to the time segment of the input audio signal by the encoder.

7. The audio encoding apparatus according to claim 1, wherein the at least one modified encoding parameter causes the encoder to perform a re-quantization in the frequency domain in at least one selected frequency area.

8. The audio encoding apparatus according to claim 7, wherein the at least one selected frequency area contributes the most energy in the overall signal or is perceptually least relevant.

9. The audio encoding apparatus according to claim 1, wherein the rounding procedure is modified for a frequency area carrying the highest power contribution.

10. The audio encoding apparatus according to claim 1, wherein the rounding procedure is further modified by increasing a quantization precision compared to a quantization precision used in the encoding the time segment of the input audio signal.

11. The audio encoding apparatus according to claim 1, wherein the modified encoding parameter causes the encoder to introduce changes in at least one of amplitude and phase to at least one frequency area to reduce a peak amplitude.

12. The audio encoding apparatus according to claim 11, further comprising an audibility analyzer for assessing an audibility of the introduced modification.

13. The audio encoding apparatus according to claim 11, further comprising a peak amplitude determiner connected to an output of the decoder for checking a reduction of the peak amplitude in the time domain.

14. The audio encoding apparatus according to claim 13, configured to repeat the introduction of a change in at least one of amplitude and phase and the checking of the reduction of the peak amplitude in the time domain until the peak amplitude is below a necessitated threshold.

15. A method for audio encoding comprising:

encoding, by an encoder, a time segment of an input audio signal to be encoded to acquire a corresponding encoded signal segment, the encoding comprising a quantizing using a quantization threshold as an encoding parameter in the encoding the time segment;

decoding, by a decoder, the encoded signal segment to acquire a decoded signal segment;

analyzing, by a clipping detector, the decoded signal segment with respect to at least one of an actual or an perceptual signal clipping;

generating a corresponding clipping alert; and in dependence of the clipping alert repeating the encoding of the time segment of the input audio signal with at least one modified encoding parameter resulting in a reduced clipping probability, the at least one modified encoding parameter causing a modification of a rounding procedure by selecting a modified quantization threshold in the quantizing for a frequency coefficient, the modified quantization threshold being smaller than the quantization threshold used in the encoding, wherein at least one of the encoder, the decoder, and the clipping detector comprises a hardware implementation.

16. The method according to claim 15, further comprising dividing the input audio signal to acquire at least the time segment of the input audio signal.

17. The method according to claim 15, further comprising:

buffering the time segment of the input audio signal as a buffered segment while the time segment is encoded and the corresponding encoded signal segment is decoded; and encoding the buffered segment with the at least one modified encoding parameter.

18. The method according to claim 15, further comprising buffering the encoded signal segment while it is decoded and before it is output so that it can be superseded by a potential subsequent encoded signal segment resulting from encoding the time segment again using the at least one modified encoding parameter.

19. The method according to claim 15, wherein the action of repeating the encoding comprises applying an overall gain to the time segment by the encoder, wherein the overall gain is determined on the basis of the modified encoding parameter.

20. The method according to claim 15, wherein the action of repeating the encoding comprises performing a re-quantization in the frequency domain in at least one selected frequency area.

21. The method according to claim 20, wherein the at least one selected frequency area contributes the most energy in the overall signal or is perceptually least relevant.

22. The method according to claim 21, wherein the rounding procedure is modified for a frequency area carrying the highest power contribution.

23. The method according to claim 21, wherein the rounding procedure is further modified by increasing a quantization precision compared to a quantization precision used in the encoding the time segment of the input audio signal.

24. The method according to claim 15, further comprising:

introducing changes in at least one of amplitude and phase to at least one frequency area to reduce a peak amplitude.

25. The method according to claim 24, further comprising: assessing an audibility of the introduced modification.

26. The method according to claim 24, further comprising a peak amplitude determiner connected to an output of the decoder for checking a reduction of the peak amplitude in the time domain.

27. The method according to claim 26, further comprising:

repeating the introduction of a change in at least one of amplitude and phase and the checking of the reduction of the peak amplitude in the time domain until the peak amplitude is below a necessitated threshold.

28. A non-transitory storage medium having stored thereon a computer program for implementing the method of claim 15 when being executed on a computer or a signal processor.

* * * * *